United States Patent
Gao et al.

(10) Patent No.: US 6,424,167 B1
(45) Date of Patent: Jul. 23, 2002

(54) VIBRATION RESISTANT TEST MODULE FOR USE WITH SEMICONDUCTOR DEVICE TEST APPARATUS

(75) Inventors: Gengying Gao, Fremont; Kevin Weaver, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/533,327

(22) Filed: Mar. 22, 2000

(51) Int. Cl.$^7$ ................................................ G01R 1/04
(52) U.S. Cl. ...................................... 324/765; 324/754
(58) Field of Search ............................... 324/754, 758, 324/761, 762; 439/482, 824

(56) References Cited

U.S. PATENT DOCUMENTS

| | | | |
|---|---|---|---|
| 4,718,868 A | 1/1988 | Williams | 439/840 |
| 5,003,255 A | 3/1991 | Kazama | 324/761 |
| 5,084,673 A | 1/1992 | Kazama | 324/761 |
| 5,410,259 A | * 4/1995 | Fujihara et al. | 324/758 |
| 5,754,057 A | * 5/1998 | Hama et al. | 324/754 |
| 5,878,486 A | 3/1999 | Eldridge et al. | 29/840 |
| 5,900,738 A | 5/1999 | Khandros et al. | 324/761 |
| 5,917,707 A | 6/1999 | Khandros et al. | 361/776 |
| 5,923,180 A | * 7/1999 | Botka et al. | 324/765 |
| 5,926,951 A | 7/1999 | Khandros et al. | 29/843 |
| 5,974,662 A | 11/1999 | Eldridge et al. | 29/842 |
| 5,983,493 A | 11/1999 | Eldridge et al. | 29/855 |
| 5,994,152 A | 11/1999 | Khandros et al. | 436/617 |
| 5,998,864 A | 12/1999 | Khandros et al. | 257/723 |

\* cited by examiner

*Primary Examiner*—Vinh P. Nguyen
(74) *Attorney, Agent, or Firm*—Girard & Equitz LLP

(57) ABSTRACT

A vibration resistant test module for use with semiconductor device test apparatus that includes a test module top plate, a test module bottom plate and a plurality of spring-and-wire assemblies. The test module top and bottom plates each have a plurality of openings extending between their upper and lower surfaces. Each of the spring-and-wire assemblies includes an electrically conducting wire with a top wire end and a bottom wire end, a top electrically conducting spring connector attached to the top wire end, and a bottom electrically conducting spring connector attached to the bottom wire end. The spring-and-wire assemblies are threaded through separate openings in the test module top and bottom plates such that the top electrically conducting spring connectors extend above the upper surface of the test module top plate, while the bottom electrically conducting spring connectors extend below the lower surface of the test module bottom plate. The top and bottom electrically conducting spring connectors are used to make secure and vibration resistant electrical connections between the vibration resistant test module and other semiconductor device test apparatus components.

9 Claims, 3 Drawing Sheets

VIBRATION RESISTANT TEST MODULE FOR USE WITH SEMICONDUCTOR DEVICE TEST APPARATUS

BACKGROUND OF THE INVENTION

1. Field of the Invention

The present invention relates to semiconductor test apparatus and, in particular, to vibration resistant test modules for use with semiconductor device test apparatus.

2. Description of the Related Art

In the field of semiconductor device testing, a test module (also known as a tester load board, load module or performance board) is a mechanical and electrical interface used to connect a test system's tester head to a semiconductor device (e.g., an integrated circuit) that is undergoing testing. Conventional test modules are adapted to interface electrically and mechanically with a variety of semiconductor device test apparatus components, including semiconductor device handlers and Device-Under-Test (DUT) cards.

FIG. 1 is a schematic representation of a conventional semiconductor device test apparatus 10 aligned with a conventional probing system 12. Semiconductor device test apparatus 10 includes a tester head 14, a fixture board 16, a test module 18, and a Device-Under-Test (DUT) Card 20. The tester head 14, fixture board 16, test module 18 and DUT Card 20 are mechanically and electrically interconnected in a conventional manner to route electrical signals from the tester head 14 to the DUT card 20.

A variety of tester heads, fixture boards, test modules, and DUT cards are known. For example, tester head 14 can be an XTS FT model tester head (available from Integrated Measurement Systems Inc.), while fixture board 16 can be a model 120-576100-01 fixture board (also available from Integrated Measurement Systems, Inc.). Furthermore, test module 18 can be, for example, a Model No. 95841032-768Pin Load Module (available from Schlumberger, San Jose, Calif.) and DUT card 20 can be, for example, a model No. 32-Z2-BY6-01 DUT Card (also available from Integrated Measurement Systems Inc.).

DUT card 20 is designed to hold a socketed semiconductor device 22 (also referred to as a Device-Under-Test [DUT]). It is also known in the field to conduct high volume testing of semiconductor devices by interfacing the test module 18 with a semiconductor device handler (not shown). Probing system 12 can be, for example, an optical probing system (OPS, such as a Model IDS2000 OPS available from Schlumberger, San Jose, Calif.) or an electron beam probing system.

The combination of a semiconductor device test apparatus and a conventional probing system, such as that illustrated in FIG. 1, can be employed to test and perform failure analysis on a semiconductor device. For example, an optical probing system or an electron beam probing system can be employed to generate signals and/or images (e.g., waveforms) from a predetermined region (e.g., a P-N junction region) of the semiconductor device. These signals and/or images are generated, while electrical signals are concurrently provided to the semiconductor device from the tester head via the fixture board, test module and DUT card.

A drawback of conventional semiconductor device test apparatus is that a significant amount of mechanical vibration can be transmitted from the relatively heavy tester head (and associated fans and balancing weights) to the semiconductor device. This vibration interferes with the ability of the probing system to accurately generate signals and/or images from the predetermined region.

Conventional test modules typically employ a plurality of relatively rigid pogo pins (e.g., 768 pairs of pogo pins for a total of 1536 pogo pins) arranged in a predetermined configuration known as the "pin-out". These pogo pins serve as electrical connectors between such a pogo pin-based test module and a fixture board, as well as between the pogo pin-based test module and a DUT card. A conventional pogo pin 40, depicted in FIG. 2, is typically fabricated from solid steel or brass with a rounded end 42. Drawbacks of conventional pogo pins are that the rounded end 42 provides a relatively poor electrical contact area and the relatively rigid pogo pin transmits excessive vibration between the tester head and the semiconductor device.

Still needed in the field, therefore, is a test module for use with semiconductor device test apparatus that is resistant to vibration and that provides for a secure electrical contact between the test module and the semiconductor device test apparatus.

SUMMARY OF THE INVENTION

Test modules for use with semiconductor device test apparatus according to the present invention provide vibration resistance and a secure electrical connection between the test module and the semiconductor device apparatus. Such a test module includes a test module top plate, a test module bottom plate and a plurality of spring-and-wire assemblies.

The test module top plate and test module bottom plate each have a plurality of openings extending from their respective upper surfaces to their respective lower surfaces. Each of the plurality of spring-and-wire assemblies includes: (i) an electrically conducting wire with a top wire end and a bottom wire end; (ii) a top electrically conducting spring connector attached to the top wire end, and (iii) a bottom electrically conducting spring connector attached to the bottom wire end. Each of the spring-and-wire assemblies is threaded through separate openings in the test module top plate and test module bottom plate. The spring-and-wire assemblies are threaded such that the top electrically conducting spring connectors extend at least partially above the upper surface of the test module top plate, while the bottom electrically conducting spring connectors extend at least partially below the lower surface of the test module bottom plate.

Test modules according to the present invention employ the top and bottom electrically conducting spring connectors to make electrical connections between the test module and other semiconductor device test apparatus components, such as a fixture board, DUT card, and/or semiconductor device handler. These electrical connections are maintained by an elastic spring force of the top and bottom electrically conducting spring connectors. Since such electrical connections are compliant and spring-based, they provide vibration resistance and a secure electrical connection. In addition, the configuration of the spring-and-wire assemblies (equivalent to the "pin out" of a conventional load module) can be easily modified.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 1:
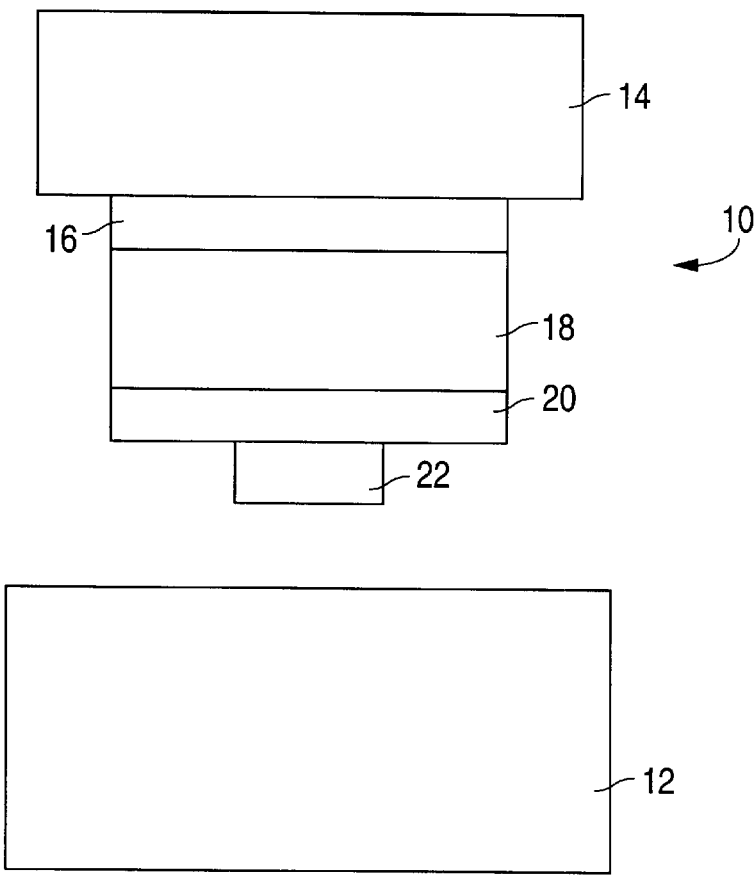
FIG. 1 is a schematic view of a conventional semiconductor device test apparatus and a conventional probing system.
Figure 2:
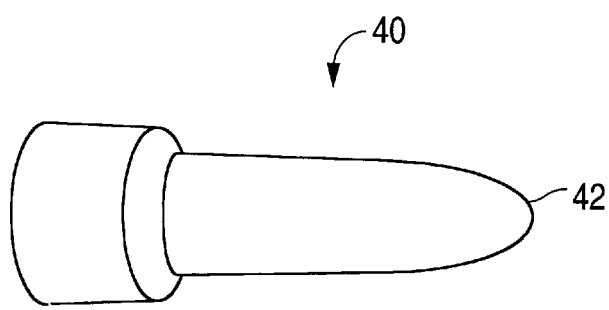
FIG. 2 is a schematic representation of a conventional pogo pin connector.
Figure 3:
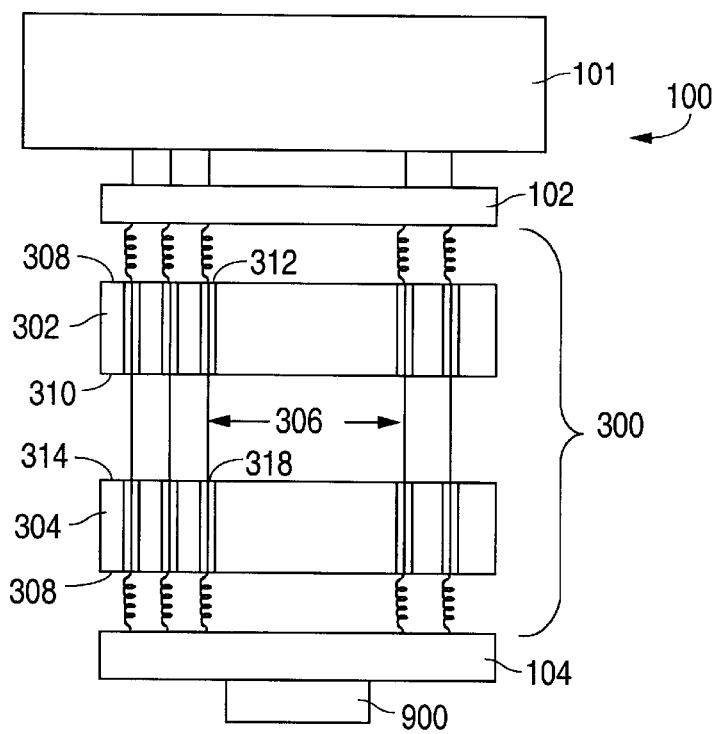
FIG. 3 is an exploded, schematic, cross-sectional view of a semiconductor device test apparatus and prober assembly, with the semiconductor device test apparatus employing a test module according to the present invention.
Figure 3:
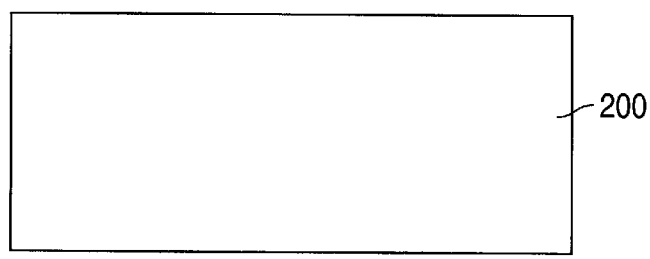

FIG. 3 is an exploded, schematic, cross-sectional view of a semiconductor device test apparatus 100 and prober assembly 200 for testing a semiconductor device 900. Semiconductor device test apparatus 100 includes a tester head 101, a fixture board 102, a DUT card 104, and a vibration resistant test module 300 according to the present invention. Vibration resistant test module 300 includes a test module top plate 302, a test module bottom plate 304 and a plurality of spring-and-wire assemblies 306. Test module top plate 302 and test module bottom plate 304 are formed of an electrically insulating material such as $Al_2O_3$, or other ceramic material.

Test module top plate 302 has an upper surface 308 and a lower surface 310 and a plurality of openings 312 extending from the upper surface 308 to the lower surface 310. Test module bottom plate 304 also has an upper surface 314 and a lower surface 316 and a plurality of openings 318 extending from the upper surface 314 to the lower surface 316. The size of test module top plate 302 and test module bottom plate 304 is appropriate to accommodate the plurality of spring-and-wire assemblies 306. A typical thickness for the test module top plate and test module bottom plate is, for example, 1.5 inches. When assembled, the test module top plate and test module bottom plate can be held together using, for example, four screws on each side of the test module top and bottom plates. These screws can also loosely hold the vibration resistant test module 300 to the tester head 101 and/or fixture board 102, and the DUT card 104.

Figure 4:
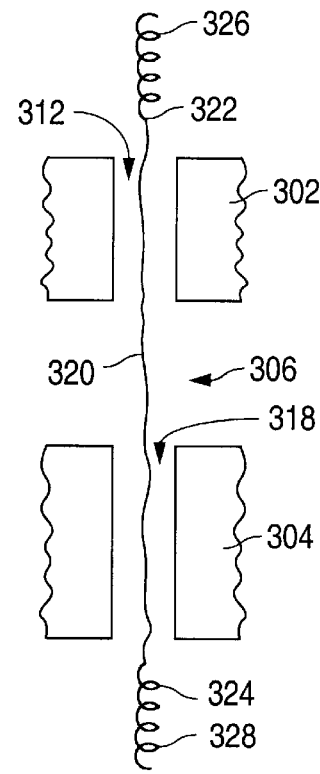
FIG. 4 is a cross-sectional depiction of a portion of a test module according to the present invention taken through an opening of the test module top plate and an opening of the test module bottom plate.

Each of the spring-and-wire assemblies 306 includes an electrically conducting wire 320 with a top wire end 322 and a bottom wire end 324, as illustrated in FIG. 4. Each of the spring-and-wire assemblies 306 also includes a top electrically conducting spring connector 326 attached to the top wire end 322 and a bottom electrically conducting spring connector 328 attached to the bottom wire end 324. As illustrated in FIGS. 3 and 4, each of the spring-and-wire assemblies is threaded through a separate opening 312 in the test module top plate 302, as well as through a separate opening 318 in the test module bottom plate 304. Such a threading arrangement provides for the top electrically conducting spring connectors 326 to extend at least partially above the upper surface 308 of the test module top plate 302 and for the bottom electrically conducting spring connectors 328 to extend at least partially below the lower surface 316 of the test module bottom plate 304. This threading arrangement also provides for the test module top plate 302 and test module bottom plate 304 to electrically isolate each of the plurality of spring-and-wire assemblies 306 from one another.

Top electrically conducting spring connector 326 and bottom electrically conducting spring connector 328 can be formed of any suitable electrically conducting material, such as tungsten. The size and shape of these top and bottom electrically conducting spring connectors are predetermined to provide a stiffness that is sufficient to suppress vibration, as well as to provide a secure electrical connection to other semiconductor device test apparatus components. For example, helical springs formed of tungsten with an outside coil diameter of 0.125 inch and length of 0.75 inch can be employed as the top and bottom electrically conducting spring connectors.

Top electrically conductive spring connectors 326 and bottom electrically conductive spring connectors 328 can be attached to the electrically conducting wire 320 using, for example, conventional lead/tin solder. If desired, however, the top electrically conducting spring connectors 326 and bottom electrically conducting spring connectors 328 can be attached to the electrically conducting wire 320 in a removable manner, thereby providing for the spring-and-wire assembly configuration to be easily changed.

Figure 5:
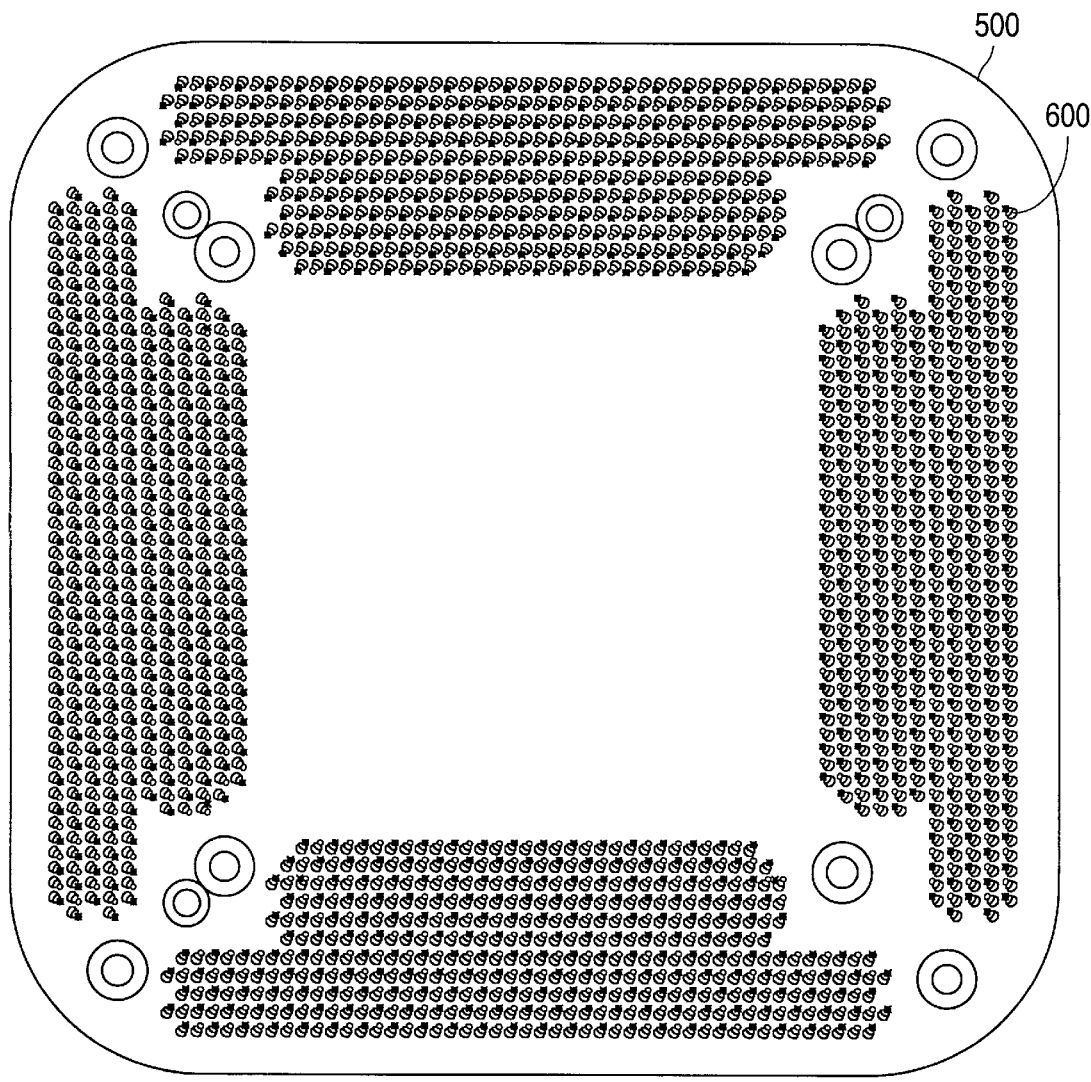
FIG. 5 is a top view of a test module top plate and plurality of top electrically conducting spring connectors according to the present invention.

FIG. 5 depicts a top view of a test module top plate 500 and plurality of top electrically conducting spring connectors 600 for use in a test module according to the present invention. The number of spring-and-wire assemblies (and therefore, the number of top electrically conducting spring connectors 600, such as those illustrated in FIG. 5) in test modules according to the present invention can be predetermined to correspond to the number of signal output channels in a given fixture board. As typical fixture boards have 576 output channels, there can be, for example, 576 spring-and-wire assemblies in a test module according to the present invention.

Referring again to FIGS. 3 and 4, spring-and-wire assemblies 306 provide for a compliant and secure spring-based electrical connection between the vibration resistant test module 300 and fixture board 102 and DUT card 104, while also eliminating, or at least reducing, vibrations between the tester head 101 and the DUT card 104.

When a semiconductor device test apparatus employing the present test module is assembled, the top wire ends and the bottom wire ends will be pushed into the openings in the test module top plate and the test module bottom plate. It is preferred that when a semiconductor device test apparatus utilizing a test module according to the present invention is assembled, the electrically conducting wires 320 be in a tension-free state. Such a tension-free state will reduce the transmission of vibration along the spring-and-wire assemblies.

The beneficial vibration-resistant characteristic of test modules according to the present invention is illustrated by the following analysis. The vibration encountered in a semiconductor device test apparatus is a mechanical vibration maintained by elastic gravity forces (also known as a "free vibration"). This type of vibration is an oscillatory, periodically repeated, motion of a body (i.e., a tester head) about a position of equilibrium. In general, test modules according to the present invention can be considered to behave as a vibration absorber. The test modules can, therefore, be effectively designed to reduce the transmission of vibrations from a component of a semiconductor device test apparatus (e.g., a tester head or a fixture board) to a Device-Under-Test. This reduction can be accomplished in test modules according to the present invention by introducing an opposing force that is equal to that of the disturbing force and, thereby, suppressing the vibratory motion of the semiconductor device test apparatus.

The vibration absorption capability of a conventional steel pogo pin can be estimated by first determining its stiffness (k) using the following equation:

$$k = EA/L \quad (1)$$

where:
- E is the modulus of elasticity of the pogo pin;
- A is the cross-sectional area of the pogo pin; and
- L is the length of the pogo pin.

The modulus of elasticity (E) for steel is approximately $0.793e^{+11}$ N/m². Typical dimensions for a conventional pogo pin are a radius (r) of 1 mm, an area (A) equal to $\pi r^2$, and a length (L) of 1 cm. The stiffness (k) calculated using Equation (1) above is $0.249e^{+08}$ N/m (or $0.142e^{+06}$ lb/in).

The maximum vibration frequency (f), which can be absorbed by such a conventional pogo pin, can be estimated by the following equation:

$$f = (1/2\pi)(k/m)^{1/2} \quad (2)$$

where:
- m = mass of a tester head connected to a pogo pin based test module.

For a conventional tester head with a mass (m) of 364 kg and a stiffness (k) of $0.249e^{-08}$ N/m, the maximum vibration frequency (f) is equal to 41.65 Hz. Therefore, a conventional pogo pin-based test module can only absorb a vibration with a frequency of 41.65 Hz. On the other hand, for a conventional tester head with a mass (m) of 364 kg and a multi-coil spring with a stiffness (k) of 332,890 lb/in, the maximum vibration frequency (f) is 63.72 Hz. Thus, test modules according to the present invention that include top and bottom electrically conducting spring connectors with a stiffness of at least 332,890 lb/in can suppress higher vibration frequencies than conventional pogo pin based test modules.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A vibration resistant test module for use with semiconductor device test apparatus for testing a device, the test module comprising:
    a test module top plate with a plurality of openings extending from its upper surface to its lower surface;
    a test module bottom plate with a plurality of openings extending from its upper surface to its lower surface; and
    a plurality of spring-and-wire assemblies, each of the spring-and-wire assemblies including:
        an electrically conducting wire with a top wire end and a bottom wire end;
        a top electrically conducting spring connector attached to the top wire end;
        a bottom electrically conducting spring connector attached to the bottom wire end,
    wherein each of the spring-and-wire assemblies is threaded through a separate opening in the test module top plate, as well as a separate opening in the bottom module test plate, such that the top electrically conducting spring connectors extend at least partially above the upper surface of the test module top plate and the bottom electrically conducting spring connectors extend at least partially below the lower surface of the test module bottom plate, whereby the top electrically conducting spring connectors can engage the test apparatus and the bottom electrically conducting spring connectors can engage the device when the test module is positioned between said test apparatus and said device.

2. The vibration resistant test module of claim 1, wherein the test module top plate and test module bottom plate are formed of an electrically insulating material, and
    whereby each of the spring-and-wire assemblies is electrically isolated from one another.

3. The vibration resistant test module of claim 2, wherein the test module top plate and test module bottom plate are formed of $Al_2O_3$.

4. The vibration resistant test module of claim 1, wherein the top electrically conducting spring connector and the bottom electrically conducting spring connector are helical springs.

5. The vibration resistant test module of claim 4, wherein the top electrically conducting spring connector and the bottom electrically conducting spring connector are helical springs formed of tungsten with an outside coil diameter of 0.125 inch and a length of 0.75 inch.

6. The vibration resistant test module of claim 1, wherein the electrically conducting wire is maintained in a tension-free state.

7. The vibration resistant test module of claim 1, wherein the top electrically conducting spring connector and the bottom electrically conductive spring connector have a stiffness (k) of at least 332,890 lb./in.

8. The vibration resistant test module of claim 1, wherein there are 576 spring-and-wire assemblies.

9. The vibration resistant test module of claim 1, wherein the device is a semiconductor device coupled to a device-under-test card, and the bottom electrically conducting spring connectors extend at least partially below the lower surface of the test module bottom plate such that said bottom electrically conducting spring connectors can engage the device-under-test card when the test module is positioned between the test apparatus and said device.

* * * * *